(12) United States Patent
Feldtkeller (10) Patent No.: US 9,197,131 B2
(45) Date of Patent: Nov. 24, 2015

(54) VOLTAGE SENSING IN A VOLTAGE CONVERTER

(71) Applicant: Infineon Technologies AG, Neubiberg (DE)

(72) Inventor: Martin Feldtkeller, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 346 days.

(21) Appl. No.: 13/756,215

(22) Filed: Jan. 31, 2013

(65) Prior Publication Data

US 2014/0211510 A1 Jul. 31, 2014

(51) Int. Cl.
| | | |
|---|---|---|
| H02M 3/335 | (2006.01) | |
| H02M 3/24 | (2006.01) | |
| G01R 19/04 | (2006.01) | |
| G01R 31/40 | (2014.01) | |

(52) U.S. Cl.
CPC .................. *H02M 3/24* (2013.01); *G01R 19/04* (2013.01); *H02M 3/33523* (2013.01); *G01R 31/40* (2013.01)

(58) Field of Classification Search
CPC ............ H02M 3/335; H02M 3/33507; H02M 3/33523
USPC ................ 363/21.08, 21.16, 97, 21.12, 21.15
See application file for complete search history.

(56) References Cited

U.S. PATENT DOCUMENTS

| | | |
|---|---|---|
| 5,956,242 A | 9/1999 | Majid et al. |
| 6,956,750 B1 | 10/2005 | Eason et al. |
| 6,990,000 B1 | 1/2006 | Rodriguez et al. |
| 7,061,780 B2 | 6/2006 | Yang et al. |
| 8,130,516 B2 | 3/2012 | Komatsu et al. |
| 8,879,289 B2 * | 11/2014 | Lin et al. .......................... 363/97 |
| 2006/0133115 A1 | 6/2006 | Phadke |
| 2008/0278131 A1 | 11/2008 | Park et al. |
| 2010/0054000 A1 | 3/2010 | Huynh |

FOREIGN PATENT DOCUMENTS

| | | |
|---|---|---|
| DE | 112007000220 T5 | 12/2008 |
| EP | 0 419 727 B1 | 2/1994 |

OTHER PUBLICATIONS

Infineon, "Control IC for Switched-Mode Power Supplies using MOS-Transistors," Infineon Technologies Datasheet, V2.0, PWM—QR IC, TDA4605-3, Jul. 1, 2002, 23 pages.
Telefus, M., et al., "Pulse Train Control Technique for Flyback Converter," IEEE Transactions on Power Electronics, vol. 19, No. 3, May 2004, pp. 757-764.

* cited by examiner

*Primary Examiner* — Gary L Laxton
(74) *Attorney, Agent, or Firm* — Slater & Matsil, L.L.P.

(57) ABSTRACT

A method for sensing an output voltage in a voltage converter includes at least one switching element and a transformer. A voltage is sampled across an auxiliary winding or a signal obtained from the voltage across an auxiliary winding in order to obtain a plurality of samples after the at least one switching element has assumed a first operation state and until the auxiliary voltage reaches a predefined threshold. The auxiliary winding is inductively coupled with the transformer. At least one sample obtained is evaluated before the auxiliary voltage reaches the predefined threshold.

20 Claims, 10 Drawing Sheets

500
VOLTAGE SENSING IN A VOLTAGE CONVERTER

TECHNICAL FIELD

Embodiments of the present invention relate to a method and a circuit for sensing a voltage in a voltage converter, in particular for sensing the output voltage in a voltage converter including a transformer.

BACKGROUND

Voltage converters are widely used in industrial, automotive or consumer electronics applications for converting a first voltage into a second voltage, wherein the first voltage and the second voltage are different in at least one of a voltage level and a signal waveform. Switched-mode converters (switched-mode power supplies) include at least one switching element that generates a pulse-width modulated (PWM) voltage from the first voltage, and the PWM voltage is received by a rectifier circuit that generates the second voltage from the first voltage. The voltage level of the second voltage can be controlled by controlling a duty cycle of the PWM voltage in this type of voltage converter.

There are switched-mode converters in which the rectifier circuit includes a transformer that provides for a potential barrier between an input where the first voltage is applied thereto, and the output where the second voltage is available. In this type of converter, the switching element is usually coupled to the primary winding of the transformer, that is the switching element is arranged in a primary side section of the rectifier circuit, while the second voltage is available in a secondary side section of the rectifier circuit. In order to be able to control the output voltage by suitably switching the switching element, the voltage level of the output voltage needs to be communicated from the secondary side section to the primary side sections.

There is therefore a need to provide a method and a circuit for efficiently communicating a voltage level of a voltage converter output voltage from a secondary side to a primary side.

SUMMARY OF THE INVENTION

A first embodiment relates to a method for sensing an output voltage in a voltage converter that includes at least one switching element and a transformer. The method includes sampling a voltage across an auxiliary winding or a signal obtained from the voltage across an auxiliary winding in order to obtain a plurality of samples after the at least one switching element has assumed a first operation state and until the auxiliary voltage reaches a predefined threshold, wherein the auxiliary winding is inductively coupled with the transformer, and evaluating at least one sample obtained before the auxiliary voltage reaches the predefined threshold.

A second embodiment relates to a voltage converter. The voltage converter includes at least one switching element, a transformer, and an auxiliary inductively coupled with the transformer. A sensing circuit is coupled to the transformer and is configured to obtain a plurality of samples after the at least one switching element has assumed a first operation state and until the auxiliary voltage reaches a predefined threshold, and to evaluate at least one sample obtained before the auxiliary voltage reaches the predefined threshold.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION OF ILLUSTRATIVE EMBODIMENTS

In the following Detailed Description, reference is made to the accompanying drawings, which form a part thereof, and in which is shown by way of illustration specific embodiments in which the invention may be practiced.

Figure 1:
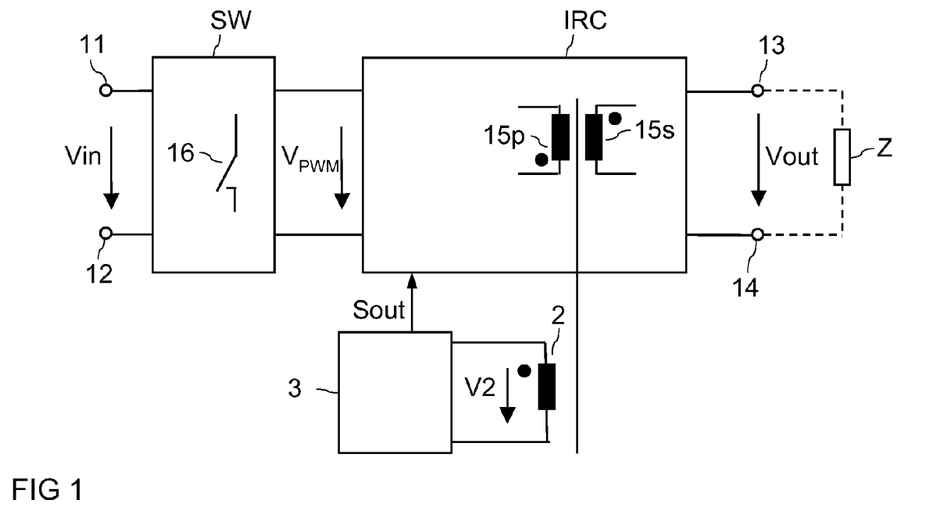
FIG. 1 schematically illustrates as first embodiment of a switch-mode voltage converter circuit.

FIG. 1 schematically illustrates a first embodiment of switched-mode voltage converter (which can also be referred to as switch-mode power converter) that will be referred to as voltage converter in the following. Referring to FIG. 1, the voltage converter includes an input with input terminals 11, 12 for receiving an input voltage Vin, and an output with output terminals 13, 14 for providing an output voltage Vout. The voltage converter is configured to generate the output voltage Vout from the input voltage Vin, wherein the input voltage Vin and the output voltage Vout have at least one of different voltage levels and signal waveforms. According to one embodiment, the input voltage Vin and the output voltage Vout are direct voltages (DC voltages) and have different voltage levels, e.g., the input voltage Vin has a higher voltage level than the output voltage Vout. According to a further embodiment, the input voltage Vin is an alternating voltage (AC voltage) such as a voltage with a sinusoidal waveform, while the output voltage Vout is a direct voltage.

Referring to FIG. 1, the voltage converter includes a switching circuit SW with at least one electronic switch 16 and an inductive rectifier circuit IRC with at least one transformer 15. The switching circuit SW with the electronic switch 16 is configured to receive the input voltage Vin and to generate a pulse-width modulated voltage $V_{PWM}$ received by the inductive rectifier circuit IRC. The inductive rectifier circuit IRC transforms the PWM voltage $V_{PWM}$ into the output voltage Vout. The PWM voltage $V_{PWM}$ is generated by driving the at least one switching element 16 in a pulse-width modulated fashion. The output voltage Vout can be controlled by controlling the duty-cycle of a PWM drive signal that switches the at least one electronic switch 16 on and off. That is, the output voltage can be controlled by adjusting a duty-cycle of the PWM operation of the at least one electronic switch 16. In particular, the output voltage Vout can be controlled to have a predefined voltage level and/or a predefined signal waveform that is in accordance with a reference signal.

In order to control the output voltage Vout a voltage level of the output voltage Vout needs to be communicated to the switching circuit SW. In the embodiment of FIG. 1, a sensing circuit generates an output signal Sout that represents a voltage level of the output voltage Vout. The switching circuit receives the output signal Sout and adjusts a duty-cycle of the PWM operation of the at least one switching element 16 dependent on the output signal Sout in order to control the voltage level of the output voltage Vout.

Referring to FIG. 1, the sensing circuit includes an auxiliary winding 2 that is inductively coupled with the transformer 15 of the inductive rectifier circuit IRC and an evaluation circuit 3. The evaluation circuit 3 is configured to evaluate a voltage V2 across the auxiliary winding and to generate the output signal Sout from this voltage V2. The voltage V2 across the auxiliary winding will be referred to as auxiliary voltage in the following.

Figure 2:
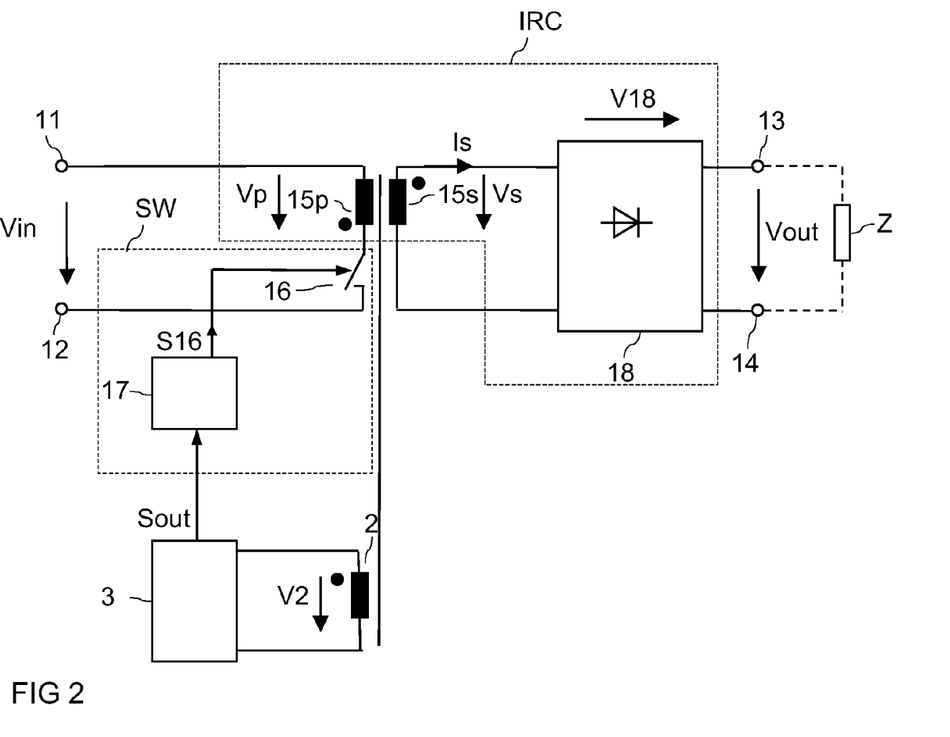
FIG. 2 schematically illustrates one embodiment of a voltage converter circuit in greater detail.

A more specific embodiment of a voltage converter with a switching circuit that includes at least one switching element 16 and with an inductive rectifier circuit that includes at least one transformer 15 is illustrated in FIG. 2. The voltage converter of FIG. 2 is implemented with a flyback converter topology. In this case, a switching element 16 is connected in series with a primary winding 15p of the transformer 15, and the series circuit with the switching element 16 and the primary winding 15p is connected between the input terminals 11, 12. The switching element 16 and a drive circuit 17 form the switching circuit SW explained before. The drive circuit 17 receives the output signal Sout from the sensing circuit 3 and is configured to output a PWM drive signal S16 that is received by the switching element 16 and switches the switching element 16 on and off in a PWM fashion. The drive circuit 17 adjusts a duty-cycle of the PWM drive signal S16 dependent on the output signal Sout and dependent on an internal reference signal such that the output voltage Vout represented by the output signal Sout is in correspondence with the reference signal.

The transformer 15 further includes a secondary winding 15s inductively coupled with the primary winding 15p. The transformer 15 is part of the inductive rectifier circuit IRC that, in the present embodiment, further includes a rectifier circuit 18 coupled between the secondary winding 15s and the output 13, 14.

Figure 3:
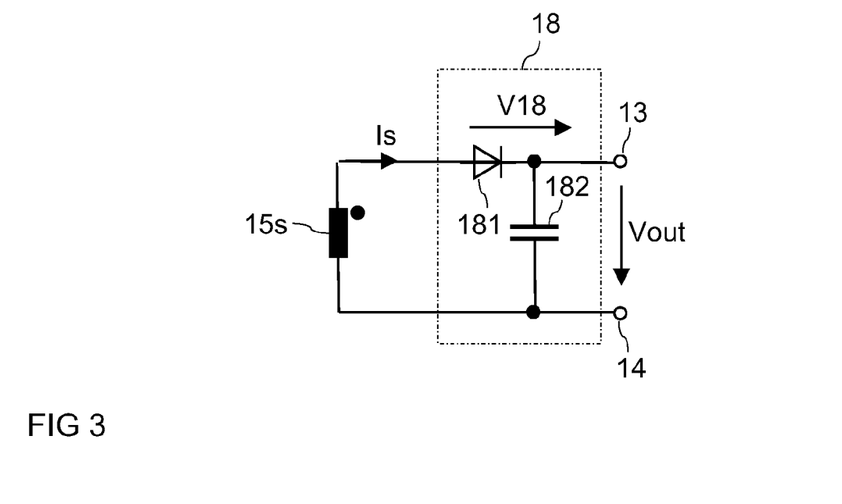
FIG. 3 illustrates a first embodiment of a rectifier circuit of the voltage converter circuit of FIG. 2.

According to one embodiment illustrated in FIG. 3, the rectifier circuit 18 includes a series circuit with a rectifier element 181 and a capacitive storage element 182, wherein the series circuit is connected in parallel with the secondary winding 15s. The output voltage Vout is available across the capacitive storage element 182. According to one embodiment, the rectifier element 181 is a diode. However, other types of rectifier elements, such as synchronous rectifiers (SR) implemented with a MOSFET (not illustrated) could be used as well. According to one embodiment, the capacitive storage element 182 is a capacitor.

The operating principle of the voltage converter of FIG. 2 is briefly explained with reference to FIG. 4 that schematically shows timing diagrams of the PWM drive signal S16, a primary voltage Vp and a secondary voltage Vs of the transformer 15. The primary voltage Vp is the voltage across the primary winding 15p and the secondary voltage Vs is the voltage across the secondary winding 15s of the transformer 15.

Figure 4:
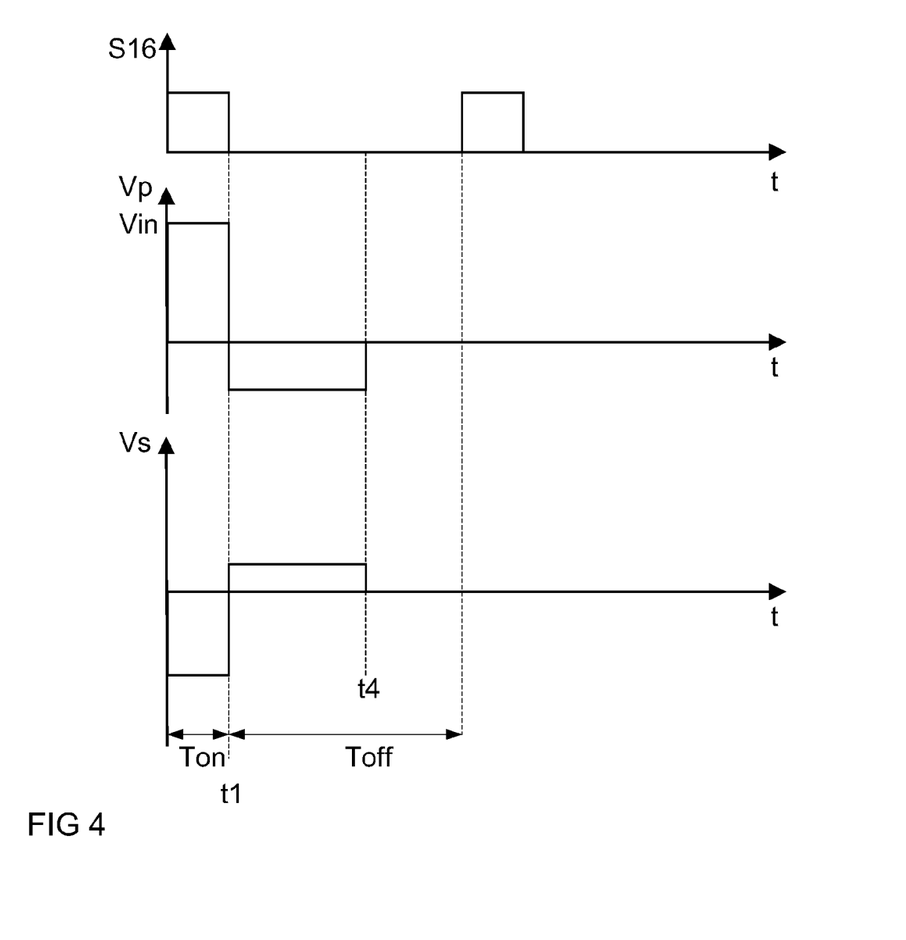
FIG. 4 shows timing diagrams schematically illustrating the operating principle of the voltage converter of FIG. 3.

FIG. 4 shows the timing diagrams in one drive cycle of the PWM drive signal S16. One drive cycle of the PWM drive signal S16 includes an on-period Ton in which the drive signal S16 switches on the switching element 16, and an off-period Toff in which the drive signal S16 switches off the switching element 16. During the on-period Ton the drive signal S16 has an on-level that switches on the switching element 16, and during the off-period Toff, the drive signal S16 has an off-level that switches off the switching element 16. For explanation purposes, it is assumed that the on-level of the drive signal S16 is a high-level, while the off-level is low-level.

Referring to FIGS. 2 and 4, the primary voltage Vp essentially correspond to the input voltage Vin during the on-period, that is when the switching element 16 is switched on. In the voltage converter of FIG. 2, the primary winding 15p and the secondary winding 15s have opposite winding senses. Thus, the primary voltage Vp and the secondary voltage Vs have opposite polarities. If, for example, the input voltage Vin is a positive voltage so that the primary voltage Vp during the on-period is a positive voltage, then the secondary voltage Vs is negative during the on-period Ton. The input voltage Vin and the secondary voltage Vs can be referenced to difference reference potentials. For example, the input voltage Vin can be referenced to a primary side reference potential (primary side ground), and the secondary voltage Vs can be referenced to a secondary side reference potential (secondary side ground).

It should be noted, that in connection with the present description, a "positive level" of the secondary voltage Vs denotes a voltage level that biases the rectifier circuit 18 such that a secondary current Is can flow from the secondary winding 15s to the output 13, 14, and a "negative level" biases the rectifier circuit such that the rectifier circuit 18 prevents a current to flow through the secondary winding Vs during the on-period Ton, that is when the secondary voltage Vd is negative. A ratio between the magnitude of the primary voltage Vp and the magnitude of the secondary voltage Vs is defined by a winding ratio of the transformer 15.

When the switching element is switched on, energy is magnetically stored in the transformer 15. When the switching element 16 switches off, the polarity of the secondary voltage Vs reverses and the secondary voltage Vs increases until a secondary current Is flows through the secondary winding 15s and the rectifier 18 to the output 13, 14 where a load Z (illustrated in dashed lines in FIG. 2) can be connected thereto. The secondary voltage Vs decreases to zero as soon as the energy previously stored in the transformer 15 has been transferred to the output 13, 14, that is as soon as the transformer 15 is completely demagnetized. During the time period in which a current flows through the secondary winding 15s there is a negative voltage across the primary winding 15p. However, a current through the primary winding 15p is zero because of the switching element 16 is blocking.

The waveform of the secondary voltage Vs during the off-period is only schematically illustrated in FIG. 4 where this voltage is drawn to increase when the switching element 16 switches off, to keep an essentially constant voltage level as long as energy is stored in the transformer 15, and then to decreases to zero.

Figure 5:
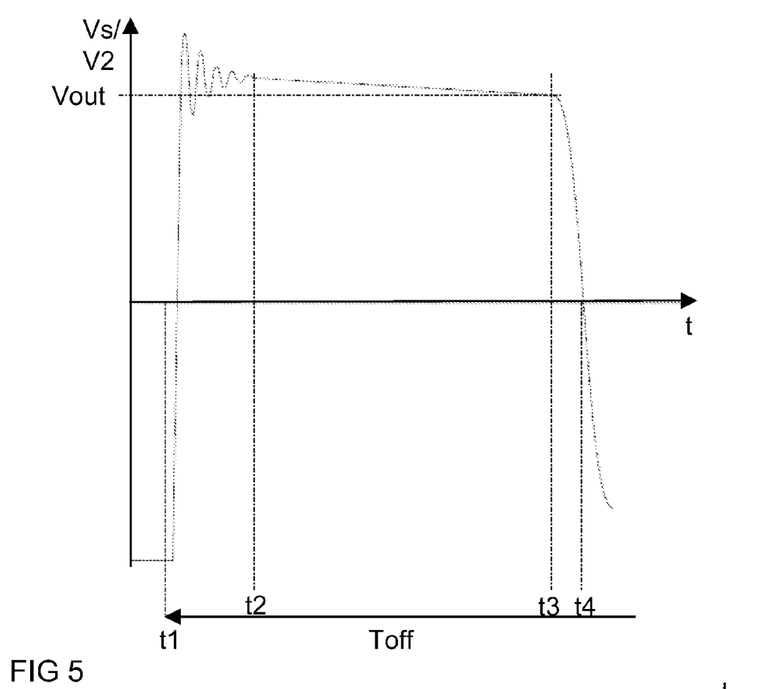
FIG. 5 illustrates the timing diagram of a voltage across a secondary winding and an auxiliary winding, respectively, of the voltage converter of FIG. 3.

In reality this waveform is less ideal. FIG. 5 shows a more realistic waveform of the secondary voltage Vs between the beginning of the off-period (represented by time t1 in FIG. 4) and the time when the transformer has been demagnetized (represented by time t3 in FIG. 4).

Referring to FIG. 5, the secondary voltage Vs at the beginning of the off-period starts to increase from the negative signal level it has during the on-period Ton towards a positive signal level. After the secondary voltage Vs has reached a maximum voltage level parasitic oscillations occur before the secondary voltage Vs (at time t2 in FIG. 5) enters a steady state in which the voltage level is essentially constant. The oscillations in the secondary voltage Vs at the beginning of the off-period Toff result from a parasitic stray inductance of the transformer and parasitic capacitances of the transformer. The secondary voltage Vs decreases to zero as the transformer has been demagnetized. At this time again oscillations may occur. However, only about one half (½) of a period of these oscillations are illustrated in FIG. 5. A time period between time t3 and time t4 corresponds to one quarter (¼) of one oscillation period. Referring to FIG. 5, t4 is the time when the secondary voltage Vs has decreased to zero, this is explained in further detail below.

Referring to FIG. 5, the secondary voltage Vs is essentially constant between a second time t2 at the end of the parasitic oscillations and a time t3 (that will be referred to as third time in the following) when the transformer 15 has been demagnetized and when the secondary voltage Vs starts to decrease towards zero. In this time period, the secondary voltage Vs essentially corresponds to the output voltage Vout plus a timely varying voltage. Referring to FIG. 5, this timely varying voltage, which corresponds to the difference between the output voltage Vout and the secondary voltage V2 substantially decreases linearly between the second and third times t2, t3.

Referring to FIG. 2, the timely varying portion of the secondary voltage V2 corresponds to a voltage V18 across the rectifier circuit 18 when the rectifier 18 conducts the secondary current Is. When the rectifier circuit 18 is implemented as illustrated in FIG. 3, with one diode 181 between the secondary winding 15s and the output 13, 14, the voltage V18 across the rectifier circuit is basically given by:

$$V18 = V_F + V_{18}(Is) \quad (1).$$

$V_F$ denotes a forward voltage of the diode 181. This forward voltage $V_F$ is substantially constant and is about 0.7V when the diode 181 is implemented with silicon. $V_{18}(Is)$ denotes a current dependent portion of the voltage $V_{18}(Is)$ which, in the present embodiment, is substantially proportional to the secondary current Is. As the secondary current Is decreases (substantially linearly) as the transformer 15 demagnetizes, $V_{18}(Is)$ also decreases (substantially linearly). At the third time t3 shortly before the secondary voltage Vs starts to decrease to zero, the transformer 15 has been demagnetized and the secondary current Is is essentially zero. Consequently, at this time t3 the secondary voltage Vs is only given by the sum of the output voltage Vout and the constant portion $V_F$ of the voltage V18 across the diode (181). This constant portion $V_F$ is defined by the design of the rectifier circuit 18, so that the secondary voltage Vs shortly before the secondary voltage Vs starts to decrease to zero, represents the output voltage Vout very well. It is therefore desirable to evaluate the secondary voltage Vs at the third time t3 or shortly before the third time t3 in order to sense the output voltage Vout and to provide the output signal Sout.

In the voltage converter of FIG. 2, the sensing circuit includes an auxiliary winding 2 that is inductively coupled with the secondary winding 15s (and of course also with the primary winding 15p). A voltage V2 across the auxiliary winding 2 during the off-period is essentially proportional to the secondary voltage Vs, wherein a proportionality factor between the secondary voltage Vs and the voltage V2 across the auxiliary winding 2 is defined by a winding ratio of these two windings 15s, 2. Thus, the timing diagram illustrated in FIG. 5 represents both, the secondary voltage Vs and the evaluated voltage V2 during the off-period Toff. Instead of the secondary voltage Vs, the voltage across the auxiliary winding 2 is evaluated in the circuit of FIG. 2. This voltage V2 will be referred to as evaluated voltage in the following. Referring to FIG. 2, the evaluation circuit 3 is coupled to the auxiliary winding 2 and is configured to generate the output signal Sout from the evaluated voltage V2.

The operating principle of the evaluation circuit 3 (and a method implemented in the evaluation circuit 3) is explained with reference to FIG. 6 in the following. FIG. 6 again shows the timing diagram of the evaluated voltage V2 between the beginning of the off-time (time t1 in FIG. 6) and the time when the evaluated voltage V2 has decreased to a predefined threshold (which is zero in the present embodiment).

Figure 6:
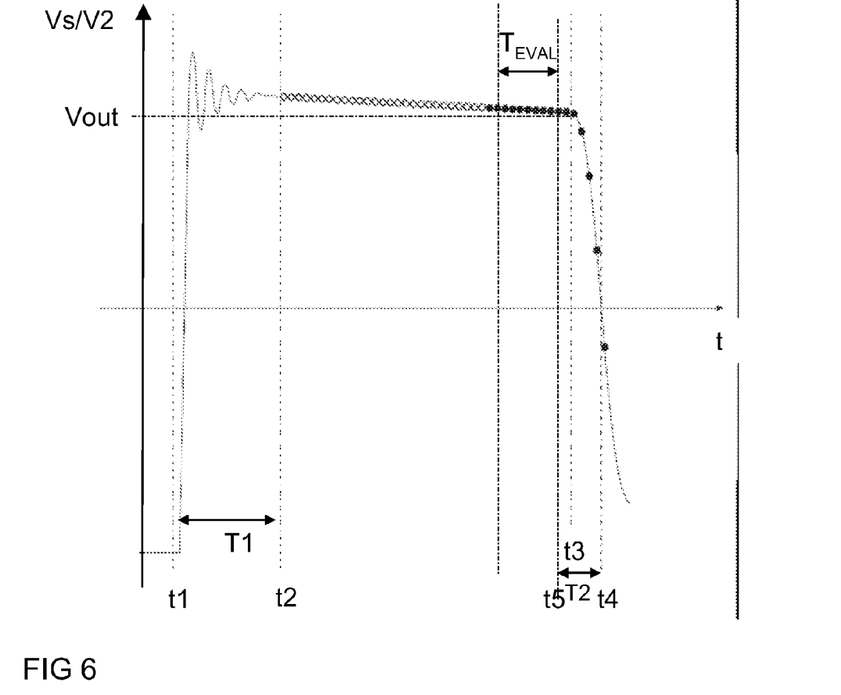
FIG. 6 shows the timing diagram of FIG. 5 and illustrates one embodiment of a method for sensing an output voltage of the voltage converter.

Referring to FIG. 6, the method performed by the evaluation circuit 3 includes sampling the auxiliary voltage V2 after the time t1 at which the switching element 16 assumes a predefined switching state, which is the off-state in the present embodiment, and until the auxiliary voltage 2 reaches a predefined threshold (at time t4), which is zero in the present embodiment.

In the embodiment illustrated in FIG. 6, sampling the auxiliary voltage V2 starts at the second time t2, after a delay time T1 after the switching element 16 switches off at the first time t1. The first time t1 is defined by the drive signal S16 that switches the switching element 16 on and off. According to one embodiment, the delay time T1 is fixed and is chosen such that it approximately corresponds to the time period or is longer than the time period for which parasitic oscillations occur after switching off the switching element 16.

Referring to FIG. 6 the method further includes selecting at least one sample obtained on or before the third time t3. In FIG. 6, T2 denotes a time period between a fifth time t5 at which the at least one evaluated sample is obtained and the fourth time t4 at which the auxiliary voltage V2 reaches the predefined threshold. This time period T2 is chosen such that the fifth time t5 corresponds to or is (slightly) before the third time t3, so that at the fifth time t5 the auxiliary voltage V2 essentially has a constant voltage level, that is before the auxiliary voltage V2 decreases towards zero. The output signal $S_{out}$ that represents the output voltage Vout is generated from at least one sample. According to one embodiment, only one sample is evaluated, namely the sample obtained at the fifth time t5. According to a further embodiment, two or more (a plurality of) samples are selected, an average of the selected sample values is calculated and the signal level of the output signal $S_{OUT}$ is generated dependent on the average. According to one embodiment, the plurality of samples includes the sample obtained at the fifth time t5 and at least one further sample directly obtained before the fifth time t5. The fifth time will also be referred to as evaluation time in the following.

According to a further embodiment, the at least one further sample is selected from a plurality of samples obtained within an evaluation period $T_{EVAL}$ ending at the fifth time t5.

Referring to the explanation above, the auxiliary voltage V2 is essentially proportional to the secondary voltage Vs, and the secondary voltage Vs essentially corresponds to the output voltage Vout plus the known forward voltage $V_F$ of the rectifier circuit 18 at the third time t3. Assuming that the evaluation time t5 is close to the third time t3, the at least one sample obtained at the fifth time t5 represents the output voltage Vout, so that the output signal $S_{out}$ when generated based on the at least one selected sample also represents the output voltage Vout. In case a plurality of samples obtained within the evaluation period $T_{EVAL}$ are evaluated, a length of the evaluation period $T_{EVAL}$ is chosen such that the auxiliary voltage V2 is substantially constant within $T_{EVAL}$.

In order to make sure that the evaluation time t5 is before the third time t3 when the auxiliary voltage Vs starts to decrease, the time period T2 is chosen such that it is at least one quarter (¼) of one period of the parasitic oscillation occurring after the third time t3. The time period between the third time t3 and the fourth time t4 corresponds to one quarter of this period. These parasitic oscillations mainly result from the inductance of the primary winding 15p and from parasitic capacitances in the circuit, such as parasitic capacitances of the transformer 15 and of the at least one switching element 16. Thus, the period of the parasitic oscillations is dependent on the specific design of the circuit. This period can be obtained by simulations or by experiments for each specific design and can be used to suitably adjust the time period T2 before operation of the circuit. According to one embodiment, T2 is between 0.2 μs and 2 μs.

Figure 7:
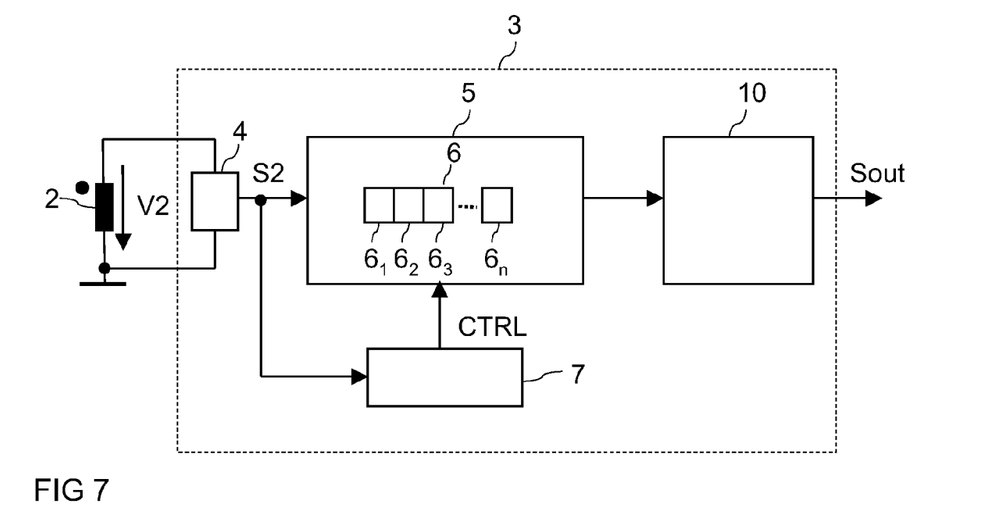
FIG. 7 illustrates one embodiment of a sensing circuit coupled to the auxiliary winding.

FIG. 7 schematically illustrates one embodiment of the evaluation circuit 3 that is configured to evaluate the auxiliary voltage V2 and to generate the output signal $S_{out}$ in the way explained with reference to FIG. 6 before. Referring to FIG. 7, the evaluation circuit 3 includes a measurement circuit 4 coupled to the auxiliary winding 2 and configured to generate a measurement signal S2 representing the auxiliary voltage V2. A sample and storage circuit 5 receives the measurement signal S2 and is configured to sample the measurement signal S2, to store samples obtained by sampling the measurement signal S2 and to output a sample or an average of at least two samples obtained within the evaluation period $T_{EVAL}$ to an output stage 10 that outputs the output signal Sout. The operation of the sample and storage circuit 5 is controlled by a control circuit 7 that also receives the measurement signal S2 and that outputs a control signal CTRL to the sample and storage circuit 5.

Figure 8:
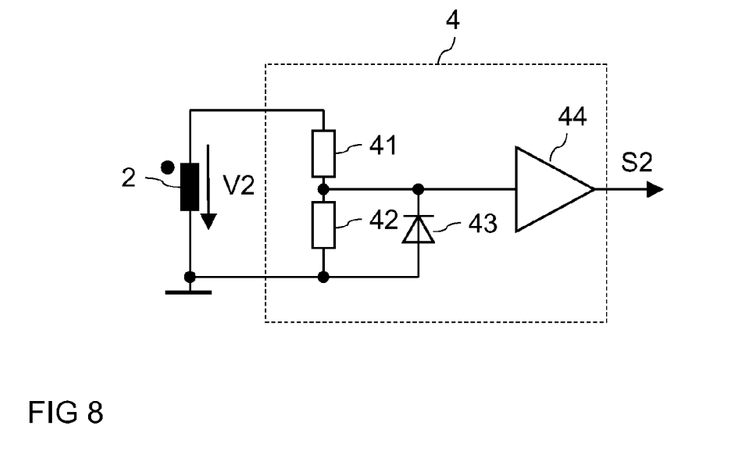
FIG. 8 illustrates one embodiment of a measurement circuit in the sensing circuit of FIG. 7.

FIG. 8 illustrates one embodiment of the measurement circuit 4. This measurement circuit 4 includes a voltage divider with a first and a second resistor 41, 42 connected in series. The series circuit with the resistors 41, 42 is connected in parallel with the auxiliary winding 2. The measurement signal S2 representing the voltage V2 across the auxiliary winding 2 is available at a tap (output) of the voltage divider, which is a circuit node common to the first and second resistors 41, 42. Optionally, a buffer 44 receives the electrical potential at the tap and provides the measurement signal S2. According to a further option, a rectifier element 43, such as a diode, is connected in parallel with one of the voltage divider resistors. In the present embodiment, the rectifier element is connected in parallel with the second divider resistor 42 and is connected such that a magnitude of a negative voltage (potential) at the tap of the voltage divider is limited to a forward voltage of the rectifier element 43. Those negative voltages at the output of the voltage divider occur when the switching element 16 is in the on-state and the input voltage Vin is applied to the primary winding 15p and may occur after the fourth time t4 illustrated in FIGS. 5 and 6 when the transformer 15 has been demagnetized and parasitic oscillations occur. Positive signal values of the auxiliary voltage, that is those signal values shortly after the first time and until the fourth time t4 are not affected by the rectifier element 43.

Figure 9:
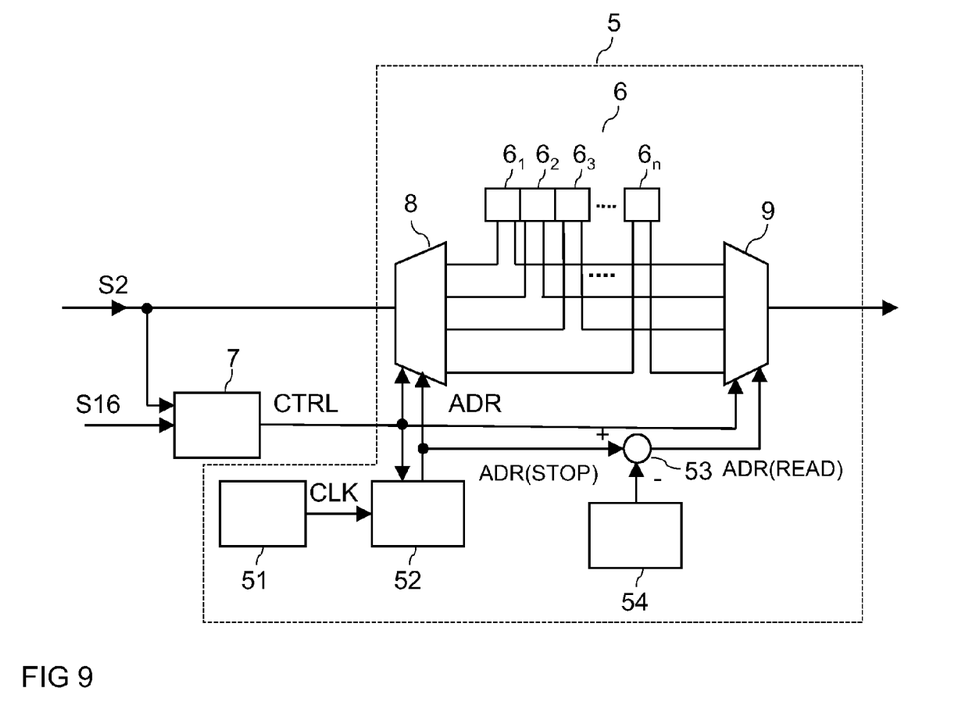
FIG. 9 illustrates a first embodiment of a sample and storage circuit in the sensing circuit of FIG. 7.

FIG. 9 shows one embodiment of the sample and storage circuit 5 in greater detail. This sample and storage circuit 5 includes a storage circuit 6 with a plurality of n storage cells $6_1, 6_2, 6_3, 6_n$. Each of these storage cells $6_1$-$6_n$ is configured to store one sample of the measurement signal S2. In FIG. 9, for illustration purposes, only four storage cells are illustrated. However, the storage circuit 6 may of course include more than four storage cells. According to one embodiment, the storage circuit 6 includes 16 storage cells, 32 storage cells, or even more than 32 storage cells.

Referring to FIG. 8 a multiplexer 8 receives the measurement signal S2 and is configured to store samples of the measurement signal S2 in accordance with an address counter signal ADR in the individual storage cells $6_1$-$6_n$. The address signal ADR includes a sequence with n different addresses, wherein each address is associated with one storage cell $6_1$-$6_n$. That is, the multiplexer 8 at one time instant stores the instantaneous signal level of the measurement signal S2 in that storage cell $6_1$-$6_n$ that is associated with the address received by the multiplexer 8 at that time instant. In the following, ADR(i) denotes one of the n counter values, and $6_i$ denotes the storage cell associated with the counter value ADR(i).

An addressing circuit 52 outputs the address signal ADR dependent on a clock signal CLK output by a clock generator 51. A frequency, at which the addressing circuit 52 changes the address defines the sampling frequency at which the measurement signal S2 is sampled. This frequency may correspond to a frequency of the clock signal CLK. However, the sampling frequency could also be lower than the clock frequency. For example, a sampling frequency that is only a fraction of 1/m of the clock frequency can be obtained by changing the address only with every m-th signal pulse of the clock signal CLK.

The addressing circuit is configured to address the n different addresses included in the address signal in a predefined order. That is, after the addressing circuit has output a sequence with n different addresses, the addressing circuit again starts to output the same address sequence. In this way, the storage circuit 6 of FIG. 9 operates like a circular buffer. That is, the multiplexer 8 in accordance with the address signal ADR writes subsequent samples in a predefined order into the individual storage cells $6_1$-$6_n$. For explanation purposes, it is assumed that a first sample is stored in a first storage cell $6_1$, a second sample is stored in a second storage cell $6_2$, and so on. After an n-th sample has been stored into the n-th storage cell $6_n$, the multiplexer 8 controlled by the address signal returns to the first storage cell $6_1$ and writes a sequence of next samples in the same predefined order as before into the storage cells $6_1$-$6_n$. In this way, always the latest n samples are stored in the storage circuit 6. The order in which the samples are written into the individual storage cells $6_1, 6_n$ is defined by the address signal CNT.

According to one embodiment, the addressing circuit 52 includes a counter that is configured to output n different counter values in a predefined order and clocked by the clock signal. For explanation purposes, it is assumed that this counter counts from 1 to n in accordance with a clock provided by the clock signal. When the counter value reaches n and the counter receives the next clock pulse it is reset to 1. In this embodiment, the address signal includes a sequence of counter values, wherein each counter value represents one address.

The control circuit 7 is configured to stop the process of sampling the measurement signal S2 and of storing samples of the measurement signal S2 in the storage circuit 6 when the measurement signal S2 that represents the auxiliary voltage V2 reaches a predefined threshold. Referring to FIG. 9, the control circuit 7 receives the measurement signal S2 and the drive signal S16 and outputs a control signal CTRL to the multiplexer 8 and the addressing circuit 52. According to one embodiment, the control signal CTRL can have two different signal levels, namely a first level and a second level. The first level will also be referred to as sample and store level, and the second level will be referred to as readout level in the following. When the control signal CTRL has the sample and store level, the multiplexer 8 and the addressing circuit 52 are enabled to sample the measurement signal S2 and to store samples of the measurement signal in the storage circuit 8. When the control circuit CTRL has the readout level, the multiplexer 8 and/or the counter 52 are disabled, so that no new samples are stored in the storage circuit 6 and at least one sample is read out from the storage circuit 6. This is explained in further detail below. In the embodiment of FIG. 9, the control signal CTRL changes from the sample and store level to the readout level when the measurement signal reaches or falls below the predefined threshold. However, instead of the measurement signal S2 any other signal derived from the auxiliary voltage V2 may be used to detect those times at which the secondary voltages Vs reaches zero and to generate the control signal CTRL.

Figure 10:
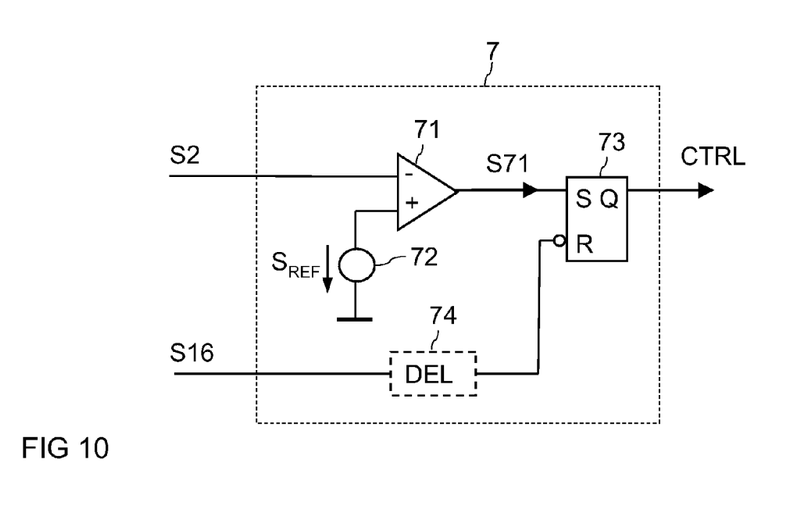
FIG. 10 illustrates one embodiment of a control circuit in the sensing circuit of FIG. 7.

One embodiment of the control circuit 7 is illustrated in FIG. 10. In this embodiment, the control circuit 7 includes a comparator 71 that compares a signal level of the measurement signal S2 with a signal level of a reference signal $S_{REF}$. The reference signal $S_{REF}$ represents the predefined threshold. When the signal level of the measurement signal S2 reaches or falls below the reference signal $S_{REF}$, a comparator output signal S71 changes to a signal level indicating that the measurement signal S2 has reached or fallen below the reference signal $S_{REF}$. The comparator output signal S71 then causes the control signal CTRL to change from the first level to the second level. The control signal CTRL is kept on the second level until the switching element 16 is again switched off. This functionality can be obtained in many different ways. In the present embodiment, a flip-flop such as a SR flip-flop stores the change of the signal level of the comparator output signal S71. The flip-flop is set when the measurement signal S2 reaches the threshold $S_{REF}$ and a falling edge of drive signal S16 resets the flip-flop 73 when the drive signal S16 assumes the off-level. In order to prevent that sampling of the auxiliary voltage V2 already starts at the first time t1 an optional delay element 74 delays the drive signal S16 received at the reset input of the flip-flop 73. A delay time of this flip-flop 74 corresponds to the time T1 (see FIG. 6) between the first time t1 at which the switching element 16 switches off and the time t2 at which sampling of the auxiliary voltage V2 and of the measurement signal S2 respectively, starts.

Referring to FIG. 6, the evaluation time t5 ends a number of sample periods before the fourth time t4 at which the auxiliary voltage V2 reaches the predefined threshold (zero in the embodiment of FIG. 6). In order to evaluate the at least one sample obtained at the evaluation time t5, the at least one sample written at the evaluation time t5 into the storage circuit 6 has to be read out from the storage circuit 6. In the sample and storage circuit 5 of FIG. 9, the storage cells that has been written at the evaluation time t5 is identified using the counter signal address. In the following ADR(STOP) denotes the address of the address signal ADR at the time the control signal CTRL disables the addressing circuit 52 and the first multiplexer 8. This address will be referred to as stop address in the following. The stop address ADR(STOP) defines the storage cell into which the latest sample has been written. This sample can be a sample obtained shortly before or shortly after the auxiliary voltage V2 (or the measurement signal S2) reaches the predefined threshold, that is shortly before or shortly after the fourth time t4. Inevitably, there is a delay time between the measurement signal S2 reaching the threshold and the control circuit 7 deactivating the counter and the multiplexer, so that one or more samples may be written into the storage circuit 6 after the fourth time t4.

Storage cells that have been written a number of sample periods before the latest sample has been written into the storage cell represented by (addressed by) ADR(STOP) can be easily identified using the stop address and the order in which the addressing circuit 52 generates the address signal. If, for example, the sample obtained p sample periods before the latest sample is to be evaluated, the address where this sample has been written can be easily obtained by going back p addresses from the stop address ADR(STOP) in the address sequence.

In the embodiment of FIG. 9, a calculation unit 53 receives the stop address ADR(STOP) and the parameter p and calculates the address ADR(READ) of the at least one storage cell to be read out. The order in which the addressing circuit 52 generates the addresses can be stored in the calculation unit so as to enable the calculation unit 53 to obtain the address to be read out.

In the embodiment where the addressing circuit 52 includes a counter that is periodically incremented (decremented) by the clock signal, and where the addresses are increasing (decreasing) counter values, the read address ADR (READ) can be calculated from the stop address ADR(STOP) by subtracting (adding) the parameter p.

For explanation purposes, it is assumed that a difference between subsequent addresses (each represented by a counter value) in the address signal ADR is q, so that ADR(i+1)−ADR (i)=q, where ADR(i+1) and ADR(i) denote subsequent addresses in the address signal ADR. q will be referred to as increment in the following. This increment can be a positive value, wherein in this case the counter periodically increments the counter value, or can be a negative value, wherein in this case the counter periodically decrements the counter value. According to one embodiment, q=1.

For explanation purposes, it is further assumed that the evaluation time t5 is that time that is p sample periods before the latest sample is written into the storage cell at ADR (STOP). The parameter p is selected such that p times one sample period corresponds to (or is slightly longer than) the time period T2 explained with reference to FIG. 6. That is, p times one sample period is at least one quarter of one period of the parasitic oscillations occurring after the third time t3. For the ease of explanation, it is further assumed that only the sample obtained at the evaluation time t5 (that optionally defines the end of the evaluation period $T_{EVAL}$) is to be evaluated. In this case, the read address ADR(READ) can be calculated based on the stop address as:

$$ADR(READ)=ADR(STOP)-p \cdot q. \tag{2}$$

The calculation unit can be implemented as a simple subtractor that subtracts p·q from ADR(STOP). p·q is stored in a storage 54 such as a register in the present embodiment. The calculation unit 53 calculates the difference between ADR (STOP) and p·q such that, dependent on the relationship between ADR(STOP) and p·q the calculation unit 53 either outputs the difference or outputs the highest possible address plus the difference. Assume, for example, that the address signal ADR represent addresses between 1 and n and that the increment q is 1. If the offset p·q is larger than ADR(STOP), then the difference would underflow the address range. In this case, the address n+ADR(STOP)−p·q will be output as the read address ADR(READ). In each case, the read address ADR(READ) corresponds to the address of the storage cell that has been written p sample periods before the latest sample.

A second multiplexer 9 that is activated by the control signal CTRL when the first multiplexer is deactivated receives the read address ADR(READ), reads the sample from the storage cell associated with the read address ADR (READ) and forwards the sample to the output stage (10 in FIG. 7).

According to a further embodiment, the second multiplexer 9 does not only read the sample stored in the storage cell represented by ADR(READ), but also reads samples from neighboring storage cells which are storage cells that have been written directly before the storage cell represented by ADR(RERAD), but within the evaluation period $T_{EVAL}$. In this case, the multiplexer 9 at one time or subsequent in time provides two or more samples to the output stage 10. In this case, the output stage 10 calculates the average of these samples and outputs the output signal $S_{OUT}$ dependent on the average.

Figure 11:
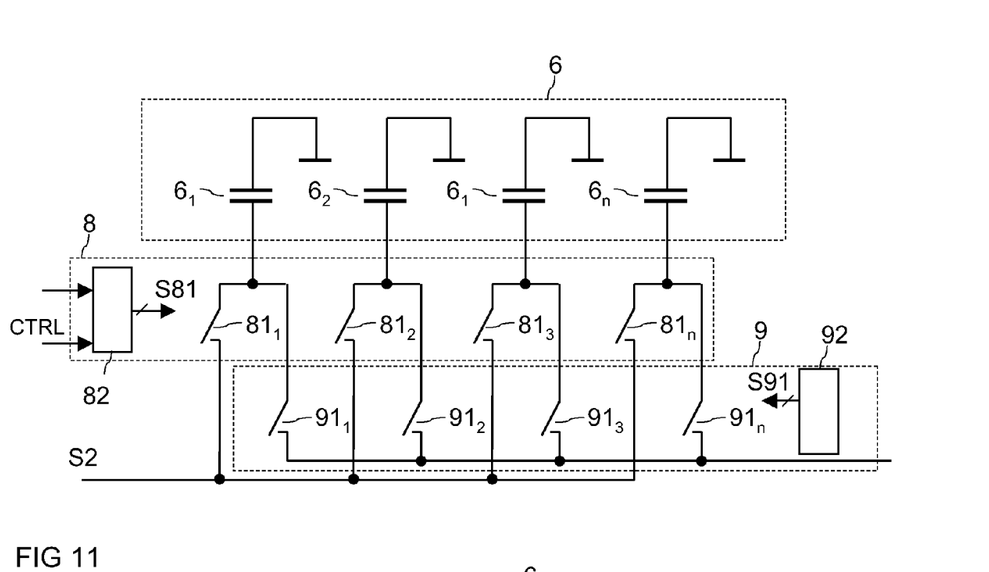
FIG. 11 shows one embodiment of a storage circuit of FIG. 9 in greater detail.

FIG. 11 illustrates one embodiment of the storage circuit 6. In the embodiment of FIG. 6, the individual storage cell $6_1$-$6_n$ are implemented as capacitive storage elements, in particular as capacitors connected between a terminal for a reference potential such as the primary side reference potential and the multiplexer 8. In this embodiment, the multiplexer 8 includes a plurality of switches $81_1$-$81_n$, wherein each switch is connected between one of the capacitive storage elements $6_1$ and the output of the measurement circuit 2 (not illustrated in FIG. 11) where the measurement signal S2 is available. The multiplexer 8 further includes a drive circuit 82 that receives address signal CNT and that drives the individual switches $81_1$-$81_n$ dependent on the address signal ADR. The operating principle of the storage circuit 6 is as follows. For explanation purposes, it is assumed that a sample of the measurement signal S2 at one time instant is to be stored in storage cell $6_i$ (wherein $6_i$ denotes an arbitrary one of the storage cells) represented by the address ADR(i) at this time instant. The drive circuit 82 then closes switch $81_i$ associated with the storage cell $6_i$ so that the capacitive storage element $6_i$ is charged up to a voltage corresponding to the signal level of the measurement signal S2.

Referring to FIG. 11, the second multiplexer 9 also includes a plurality of switches $91_1$-$91_n$, wherein each of these switches is connected between one of the storage elements $6_1$-$6_n$ and an output of the storage circuit 6, wherein the output is coupled to the output stage 10 (not illustrated in FIG. 11). A drive circuit 92 is configured to switch on and off the individual switches $91_1$-$91_n$ dependent on the read address ADR(READ). In order to read the sample from the storage element represented by the address ADR(READ), the drive circuit 92 closes the switching element associated with this storage cell so as to couple the corresponding storage cell to the output stage 10 that evaluates the sample. More specifically, in the embodiment of FIG. 11, the output stage 10 evaluates a voltage level of a voltage across the corresponding capacitive storage element.

Optionally, the drive circuit 92 dependent on the address ADR(READ) couples two or more neighboring capacitive storage elements at once to the output. "Neighboring storage cells" are those storage cells that are written subsequently. The electrical voltage at the output then corresponds to an average of the voltages previously stored in these capacitive storage elements.

Figure 12:
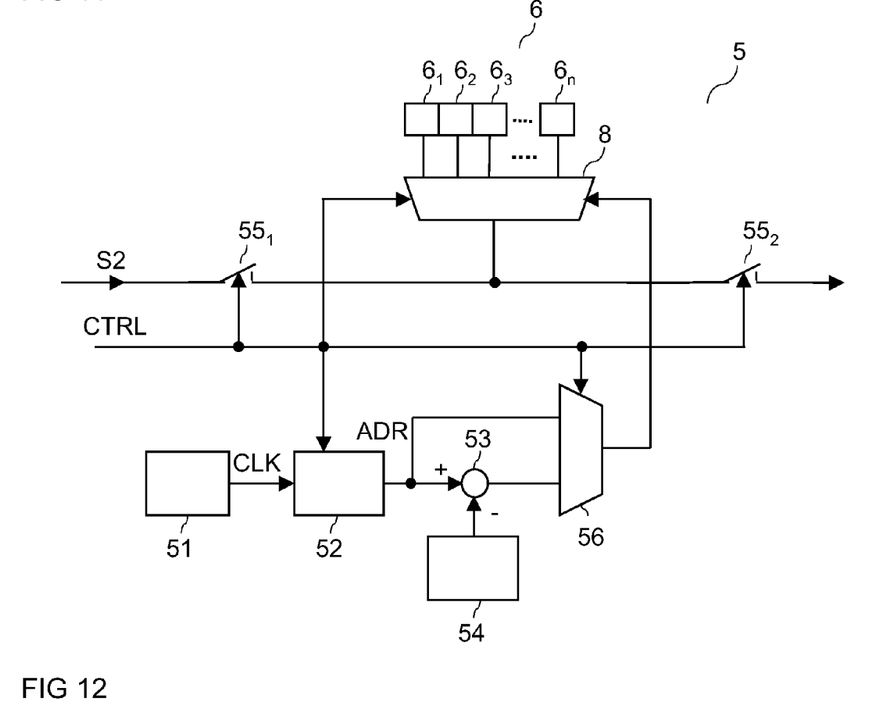
FIG. 12 illustrates a second embodiment of a sample and storage circuit.

FIG. 12 illustrates a further embodiment of the sample and storage circuit 5. This embodiment uses only one multiplexer 8 that is used for storing samples in the storage circuit 6 and for retrieving samples from the storage circuit 6. In this case, the control circuit 7 controls a first pair of switches $55_1$, $55_2$. A first one of these switches is coupled between the measurement circuit (not shown) and an input/output of the multiplexer 8, and a second one is connected between the input/output of the multiplexer 8 and the output of the sample and storage circuit 6. The control circuit 7 further controls a multiplexer 56 that either forwards the address signal ADR or the read address ADR(READ) provided by the calculation unit 53 to the multiplexer. When the control signal CTRL has the sample and hold level, the first switch $55_1$ is activated, the second switch is deactivated, and the multiplexer forwards the address signal ADR provided by the addressing circuit 52 to the multiplexer 8. In this case, the measurement signal is sampled and samples are stored in the storage circuit 6.

When the control signal CTRL has the read-out level, the first switch $55_1$ is deactivated, the second switch $55_2$ is deactivated, and the further multiplexer 56 forwards the read address ADR(READ) to the multiplexer. In this case, at least one storage cell represented by the read address ADR(READ) is read out and the sample is output to the output stage 10 (not shown in FIG. 12).

Figure 13:
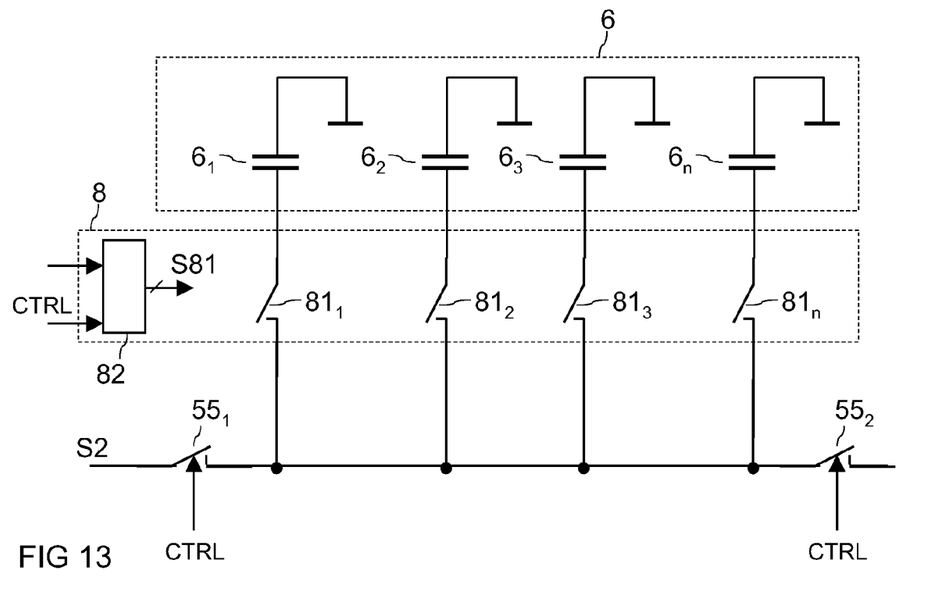
FIG. 13 illustrates a storage circuit according to a further embodiment.

FIG. 13 shows a further embodiment of the storage circuit 6. The storage circuit 6 of FIG. 13 is a modification of the storage circuit 6 of FIG. 11. In the storage circuit 6 of FIG. 13, the second multiplexer 9 illustrated in FIG. 11 is omitted.

Figure 14:
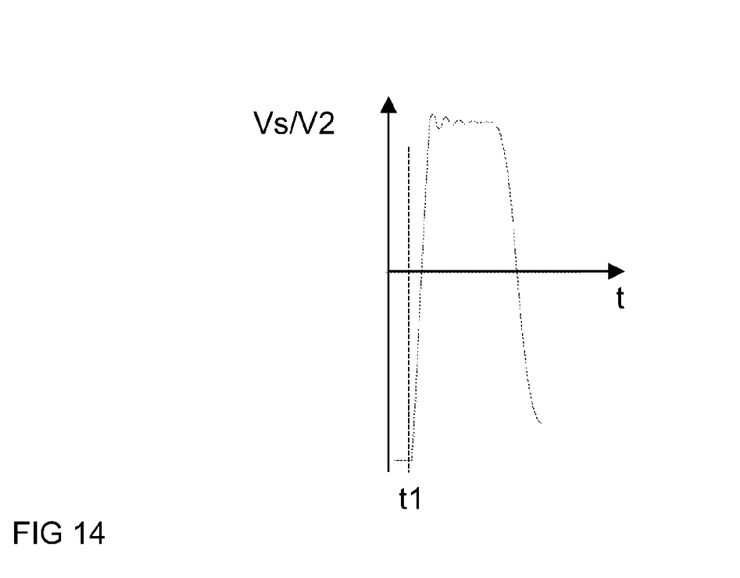
FIG. 14 shows the timing diagram of the voltage across a secondary winding and an auxiliary winding, respectively, when a demagnetization period is very short.

There may be operation scenarios of the voltage converter in which the on-periods Ton of the switching element 16 are relatively short so that in each drive cycle only a low mount of energy is stored in the transformer. Consequently, the transformer is demagnetized very fast. FIG. 14 illustrates a typical waveform of the secondary voltage Vs and the auxiliary voltage V2, respectively, in this case. Referring to FIG. 14, the auxiliary voltage V2 immediately after the end of the parasitic oscillations starts to decrease to zero. Thus, in this case, there is no period where the auxiliary voltage V2 is essentially constant so as to be evaluated. In order to be able to provide an output signal $S_{OUT}$ also in this operation scenarios, the evaluation circuits 3 optionally includes a peak voltage detector that is configured to detect a peak voltage of the auxiliary voltage V2 or the measurement signal S2, respectively, and to output a signal representing the peak voltage.

Figure 15:
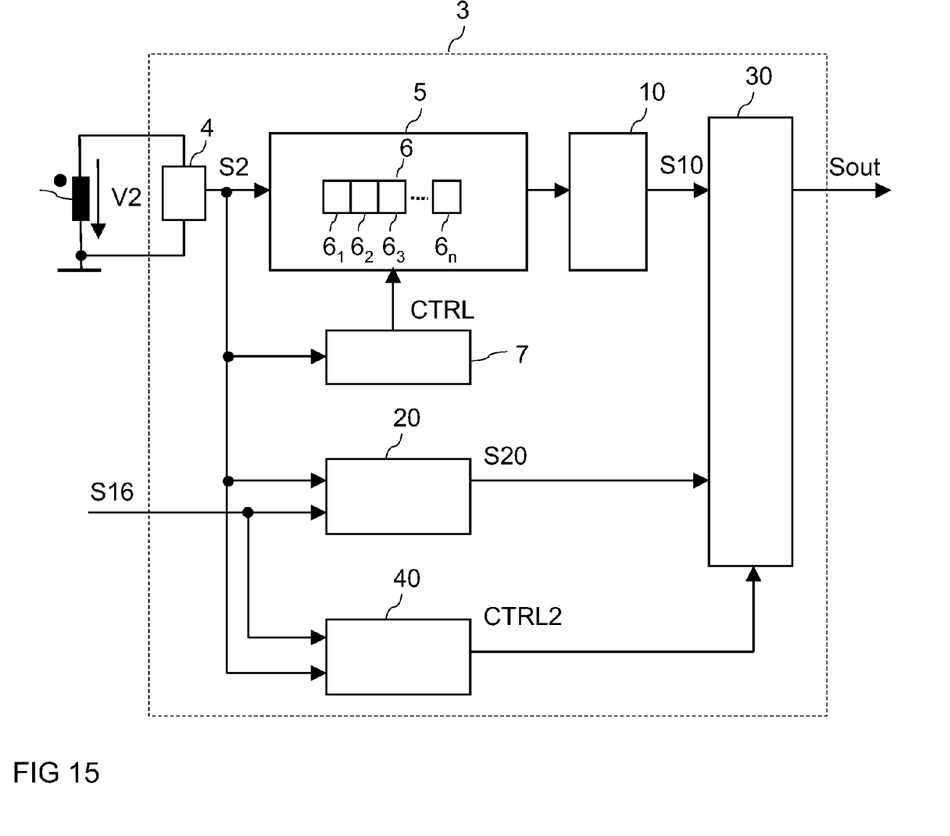
FIG. 15 illustrates a sensing circuit according to a second embodiment.

FIG. 15 illustrates one embodiment of an evaluation circuit 3 including such peak voltage detector. The embodiment of FIG. 15 is based on the embodiment of FIG. 7. Reference character 20 denotes the peak voltage detector in this embodiment. The peak voltage detector 20 receives the measurement signal S2 and outputs a peak signal S20 representing the peak voltage of the measurement signal S2. The peak voltage detector 20 can be reset at the beginning or at the end of each drive cycle. According to one embodiment, the peak voltage detector 20 receives the drive signal S16, wherein the drive signal S16 resets the peak voltage detector each time the signal level of the drive signal S16 changes from the off-level to the on-level, that is at the beginning of the on-period Ton, or when the signal level changes from the on-level to the off-level, that is at the beginning of the off-period. A multiplexer 30 receives the output of the sample and storage circuit 5 and the output of the peak voltage detector 20 and dependent on a further control signal CTRL2 outputs one of these output signals to the output stage 10. A further control circuit 40 receives a drive signal S16 and the measurement signal S2 and calculates the time between the beginning of the off-period (t1 in FIG. 6) and the fourth time t4, when the measurement signal S2 reaches the predefined threshold. When this time period is shorter than a predefined time threshold, the further control signal CTRL2 causes the multiplexer 30 to couple the output of the peak voltage detector 20 to the output of the evaluation circuit 3 where the output signal Sout is available. Otherwise, the output stage 10 connected downstream the sample and storage circuit 5 is coupled to the output of the evaluation circuit 3.

Figure 16:
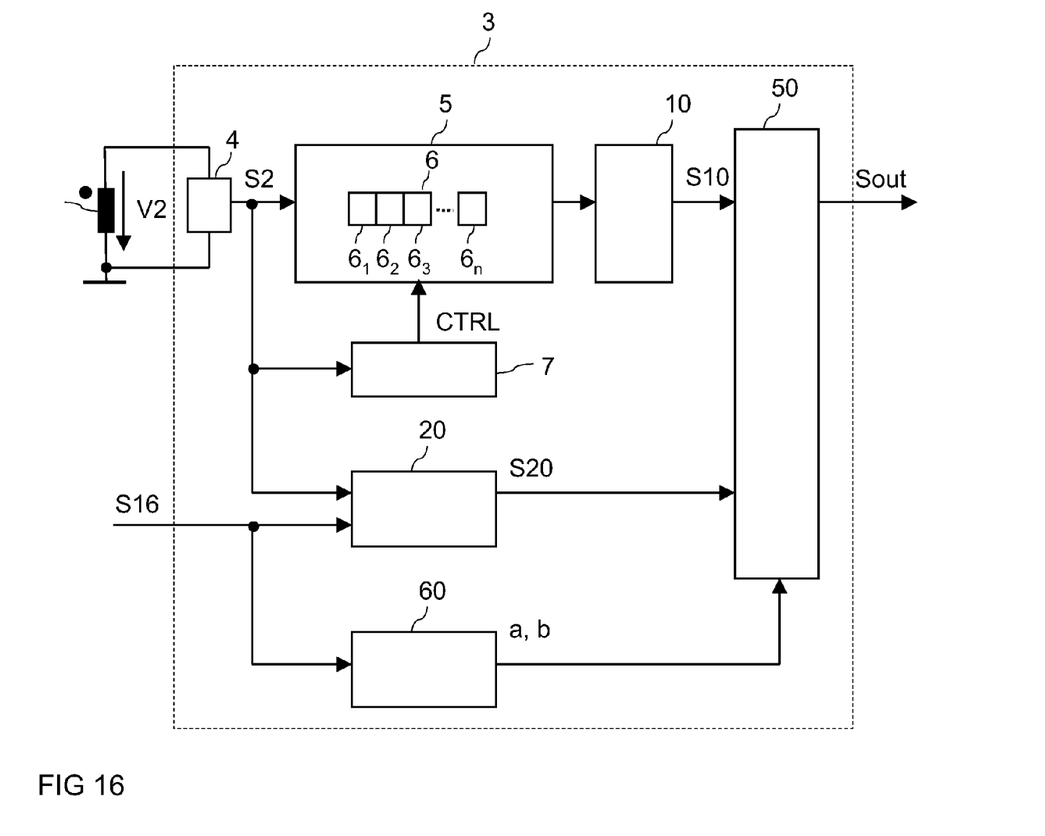
FIG. 16 illustrates a sensing circuit according to a third embodiment.

According to a further embodiment illustrated in FIG. 16, the multiplexer 30 is replaced by a calculation unit 50 that calculates the weighted sum of the peak signal S20 and the output signal of the output stage, so that:

$$Sout = a \cdot S10 + b \cdot S20 \quad (3)$$

where a+b=1 and S10 is the output signal of the output stage 10. The weighting factors a, b are calculated dependent on the output power of the voltage converter, wherein the weight of the factor a increases as the output power increases. A calculation unit 60 generates the weighting factors a, b dependent on the output power. According to one embodiment, a duty cycle of the drive signal S16 represents the output power, wherein the output power increases as the duty cycle increases. In this embodiment, the calculation unit 60 receives the drive signal S16.

Figure 17:
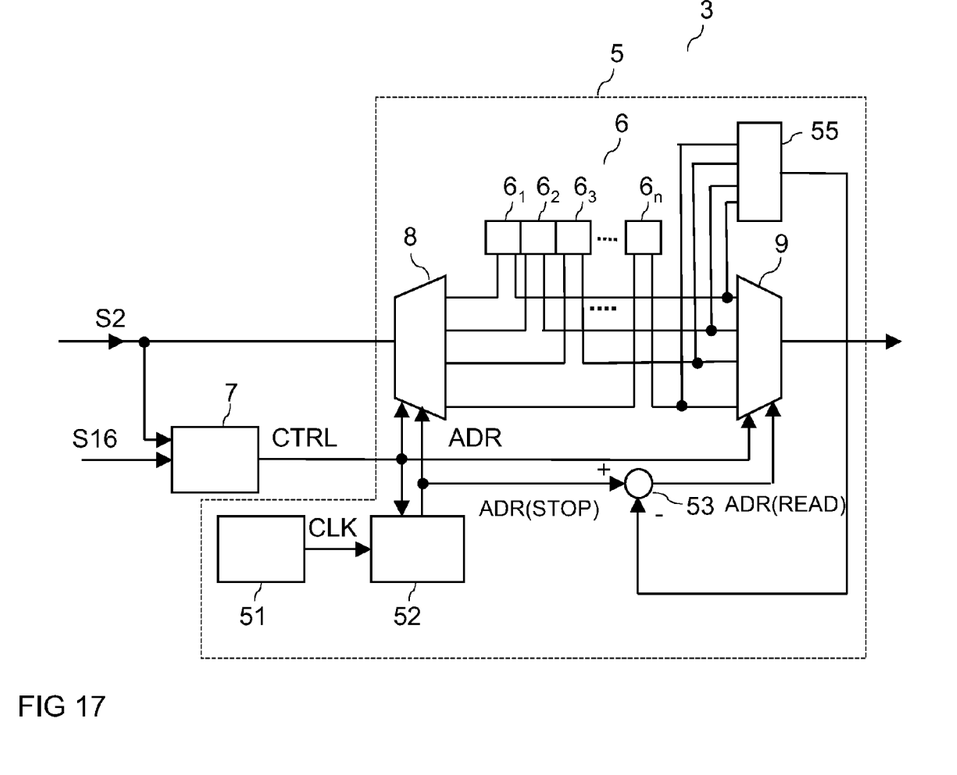
FIG. 17 illustrates a sensing circuit according to a fourth embodiment.

FIG. 17 illustrates a further embodiment of an evaluation circuit 3. This evaluation circuit 3 is based on the evaluation circuit 3 of FIG. 5 and is different from the evaluation circuit of FIG. 3 in that instead of the storage 54 a calculation circuit 55 provides the parameters p·q (or p when q=1) required for calculating the read address ADR(READ) from the stop address ADR(STOP). Referring to the explanation before, p is chosen such that the at least one evaluated sample (the sample obtained at the evaluation time t5) is the one obtained on or before the third time t3. In the embodiment of FIG. 17, the calculation circuit 55 is coupled to the storage circuit 6 and is configured to determine the sample obtained at the third time t3 based on the samples stored in the storage circuit 6. This calculation circuit 55 is controlled by the control signal CTRL and is activated when the control signal has the read-out level. When the calculation circuit 55 is activated, it reads all the n samples stored in the storage circuit 6, and calculates the second derivative of the sample sequence retrieved from the storage circuit 6. Those samples where the second derivative of the sequence is zero are samples between the second and third time t2, t3 in the curve of the auxiliary voltage V2 and the measurement signal S2, respectively, while the second derivative of those samples obtained between the third time t3 and the fourth time t4 is negative. Thus, the latest stored sample in the sequence that has a second derivative of zero corresponds to the sample obtained at the third time t3. Based on the stop address ADR(STOP) and the address of the sample obtained at the third time t3, the calculation unit 55 then calculates the parameter p and outputs this parameter p to the calculation unit 53.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second" and the like, are also used to describe various elements, regions, sections, etc. and are also not intended to be limiting Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for sensing an output voltage in a voltage converter that comprises a switching element and a transformer, the method comprising:
sampling a voltage across an auxiliary winding or a signal obtained from the voltage across an auxiliary winding in order to obtain a plurality of samples after the switching element has assumed a first operation state and until the auxiliary voltage reaches a predefined threshold, wherein the auxiliary winding is inductively coupled with the transformer; and
evaluating at least one sample obtained before the auxiliary voltage reaches the predefined threshold, wherein evaluating the at least one sample comprises evaluating an average of a plurality of samples obtained before the auxiliary voltage reaches the predefined threshold.

2. The method of claim 1, wherein the predefined threshold is essentially zero.

3. The method of claim 1, wherein the at least one sample is obtained a predefined time before the auxiliary voltage reaches the predefined threshold.

4. The method of claim 1, wherein the at least one sample is obtained between 0.2 and 2 µs before a time at which the auxiliary voltage reaches the predefined threshold.

5. The method of claim 1, wherein sampling comprises periodically sampling the voltage across the auxiliary winding or the signal obtained from the voltage across the auxiliary winding.

6. The method of claim 1,
wherein sampling the auxiliary voltage comprises storing a group of samples in a storage circuit, the group of samples being obtained in a time window at the end of a sampling period,
wherein evaluating the at least one sample comprises obtaining the at least one sample from the storage circuit.

7. The method of claim 6, wherein the storage circuit comprises a plurality of capacitive storage elements.

8. The method of claim 1, further comprising:
detecting a peak of the auxiliary voltage after the switching element has assumed the first operation state,
wherein sensing the output voltage comprises calculating a weighted sum of the peak and of the at least one sample.

9. The method of claim 8, wherein a weight of the at least one sample increases as an output power of the voltage converter increases.

10. A method for sensing an output voltage in a voltage converter that comprises a switching element and a transformer, the method comprising:
sampling a voltage across an auxiliary winding or a signal obtained from the voltage across an auxiliary winding in order to obtain a plurality of samples after the switching element has assumed a first operation state and until the auxiliary voltage reaches a predefined threshold, wherein the auxiliary winding is inductively coupled with the transformer;
evaluating at least one sample obtained before the auxiliary voltage reaches the predefined threshold; and
obtaining a last sample, wherein the at least one sample is a sample obtained from a predefined number of samples before the last sample, wherein the predefined number is calculated using a sequence of samples, and wherein calculating the number comprises calculating a second derivative of the sequence.

11. A method for sensing an output voltage in a voltage converter that comprises a switching element and a transformer, the method comprising:
sampling a voltage across an auxiliary winding or a signal obtained from the voltage across an auxiliary winding in order to obtain a plurality of samples after the switching element has assumed a first operation state and until the auxiliary voltage reaches a predefined threshold, wherein the auxiliary winding is inductively coupled with the transformer; and
evaluating at least one sample obtained before the auxiliary voltage reaches the predefined threshold;
wherein sampling the auxiliary voltage comprises storing a group of samples in a storage circuit, the group of samples being obtained in a time window at the end of a sampling period,
wherein evaluating the at least one sample comprises obtaining the at least one sample from the storage circuit;
wherein the storage circuit comprises a number of n storage cells, wherein each storage cell is configured to store one sample; and
wherein storing the group of samples comprises storing timely subsequent samples in a predefined order in the storage cells such that after n samples have been stored in the storage circuit, each additional sample is stored in that storage cell that currently holds the oldest sample.

12. The method of claim 11, wherein obtaining the at least one sample from the storage circuit comprises:
identifying a storage cell into which a latest one of the group of samples has been written; and
identifying a storage cell into which a sample has been written a predefined number of sample periods before the latest sample and obtaining the sample from this storage cell.

13. The method of claim 12, further comprising obtaining a sample from at least one further storage cell that has been written directly before or directly after the identified storage cell has been written.

14. A method for sensing an output voltage in a voltage converter that comprises a switching element and a transformer, the method comprising:
sampling a voltage across an auxiliary winding or a signal obtained from the voltage across an auxiliary winding in order to obtain a plurality of samples after the switching element has assumed a first operation state and until the auxiliary voltage reaches a predefined threshold, wherein the auxiliary winding is inductively coupled with the transformer;
evaluating at least one sample obtained before the auxiliary voltage reaches the predefined threshold; and
detecting a peak of the auxiliary voltage after the switching element has assumed the first operation state;
wherein sensing the output voltage comprises evaluating the peak voltage when a time difference between the time when the switching element assumes the first operation state and the time when the auxiliary voltage reaches the predefined threshold is below a predefined time threshold.

15. The method of claim 14, wherein the predefined time threshold is about 1 μs.

16. A voltage converter comprising:
a switching element;
a transformer;
an auxiliary winding inductively coupled with the transformer; and
a sensing circuit coupled to the transformer and configured to obtain a plurality of samples after the switching element has assumed a first operation state and until a voltage across the auxiliary winding reaches a predefined threshold, and to evaluate at least one sample obtained before the voltage across the auxiliary winding reaches the predefined threshold, wherein the sensing circuit is configured to obtain a last sample and to evaluate at least one sample obtained from a predefined number of samples before the last sample, and the sensing circuit is configured to calculate the predefined number using a sequence of samples, wherein calculating the number comprises calculating a second derivative of the sequence.

17. The voltage converter of claim 16, wherein the sensing circuit is configured to evaluate at least one sample that is obtained a predefined time before the voltage across the auxiliary winding reaches the predefined threshold.

18. The voltage converter of claim 16, wherein the sensing circuit is configured to periodically sample the voltage across the auxiliary winding or a signal obtained from the voltage across the auxiliary winding.

19. The voltage converter of claim 16, wherein the sensing circuit further comprises a storage circuit configured to store a group of samples obtained in a time window at the end of a sampling period, and further configured to evaluate at least one sample stored in the storage circuit.

20. A voltage converter comprising:
a switching element;
a transformer;
an auxiliary winding inductively coupled with the transformer; and a sensing circuit coupled to the transformer and configured to obtain a plurality of samples after the switching element has assumed a first operation state and until a voltage across the auxiliary winding reaches a predefined threshold, and to evaluate at least one sample obtained before the voltage across the auxiliary winding reaches the predefined threshold, wherein the sensing circuit is configured to evaluate an average of a plurality of samples obtained before the voltage across the auxiliary winding reaches the predefined threshold.

* * * * *